(12) United States Patent
Hashimoto et al.

(10) Patent No.: US 10,626,502 B2
(45) Date of Patent: Apr. 21, 2020

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Yoshitomo Hashimoto, Toyama (JP); Tatsuru Matsuoka, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/989,657

(22) Filed: May 25, 2018

(65) Prior Publication Data

US 2018/0347047 A1   Dec. 6, 2018

(30) Foreign Application Priority Data

May 31, 2017   (JP) ................. 2017-107492

(51) Int. Cl.
| H01L 21/31 | (2006.01) |
| H01L 21/469 | (2006.01) |
| C23C 16/52 | (2006.01) |
| H01L 21/67 | (2006.01) |
| C23C 16/458 | (2006.01) |
| H01L 21/02 | (2006.01) |
| C23C 16/455 | (2006.01) |

(52) U.S. Cl.
CPC .......... *C23C 16/52* (2013.01); *C23C 16/4587* (2013.01); *C23C 16/45527* (2013.01); *H01L 21/0228* (2013.01); *H01L 21/02126* (2013.01); *H01L 21/02164* (2013.01); *H01L 21/02211* (2013.01); *H01L 21/02271* (2013.01); *H01L 21/67017* (2013.01); *H01L 21/67109* (2013.01)

(58) Field of Classification Search
CPC ......... H01L 21/02126; H01L 21/02164; H01L 21/02211; C23C 16/52; C23C 16/45527; C23C 16/4587
USPC ................................... 438/78, 778
See application file for complete search history.

(56) References Cited

U.S. PATENT DOCUMENTS

| 2013/0149873 | A1* | 6/2013 | Hirose | ............ H01L 21/31 438/763 |
| 2013/0260328 | A1* | 10/2013 | Takenaga | ............ F27D 19/00 432/9 |
| 2017/0011908 | A1* | 1/2017 | Matsuoka | ......... C23C 16/45531 |

(Continued)

FOREIGN PATENT DOCUMENTS

| JP | 2013-140944 A | 7/2013 | |
| WO | WO-2015199111 A1 * | 12/2015 | ............ C23C 16/02 |

*Primary Examiner* — David S Blum
(74) *Attorney, Agent, or Firm* — Volpe and Koenig, P.C.

(57) ABSTRACT

There is provided a technique that includes arranging a plurality of substrates inside a process container in a vertical direction; and forming a film on each of the plurality of substrates by supplying a process gas into the process container. The act of forming the film includes: supplying the process gas into the process container; and performing pressure control such that a pressure inside the process container becomes a process pressure. A start timing of the act of supplying the process gas is adjusted with respect to a start timing of the act of performing the pressure control to adjust a thickness of a film formed on a substrate arranged on an upper portion of the plurality of substrates.

15 Claims, 6 Drawing Sheets

(56) References Cited

U.S. PATENT DOCUMENTS

| | | | |
|---|---|---|---|
| 2017/0162386 A1* | 6/2017 | Hashimoto | C23C 16/325 |
| 2017/0221698 A1* | 8/2017 | Hashimoto | C23C 16/308 |
| 2017/0263439 A1* | 9/2017 | Hashimoto | C23C 16/45527 |
| 2017/0271144 A1* | 9/2017 | Hashimoto | C23C 16/345 |
| 2017/0365467 A1* | 12/2017 | Shimamoto | C23C 16/0272 |
| 2018/0076017 A1* | 3/2018 | Hashimoto | C23C 16/4412 |
| 2018/0218898 A1* | 8/2018 | Hirose | C23C 16/308 |

* cited by examiner

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2017-107492, filed on May 31, 2017, the entire contents of which are incorporated herein by reference.

TECHNICAL FIELD

The present disclosure relates to a method of manufacturing a semiconductor device, a substrate processing apparatus, and a recording medium.

BACKGROUND

As one of the processes of manufacturing a semiconductor device, a process of supplying a process gas to a plurality of substrates arranged in a vertical direction in a process container to form a film on the plurality of substrates may be performed.

SUMMARY

The present disclosure provides some embodiments of a technique capable of controlling the inter-substrate uniformity of film thickness when forming a film on each of a plurality of substrates arranged in a vertical direction.

According to one embodiment of the present disclosure, there is provided a technique that includes: arranging a plurality of substrates inside a process container in a vertical direction; and forming a film on each of the plurality of substrates by supplying a process gas into the process container. The act of forming the film includes: supplying the process gas into the process container; and performing pressure control such that a pressure inside the process container becomes a process pressure. A start timing of the act of supplying the process gas is adjusted with respect to a start timing of the act of performing the pressure control to adjust a thickness of a film formed on a substrate arranged on an upper portion of the plurality of substrates.

DETAILED DESCRIPTION

One Embodiment of the Present Disclosure

One embodiment of the present disclosure will now be described with reference to FIGS. 1 to 5.

(1) Configuration of Substrate Processing Apparatus

Figure 1:
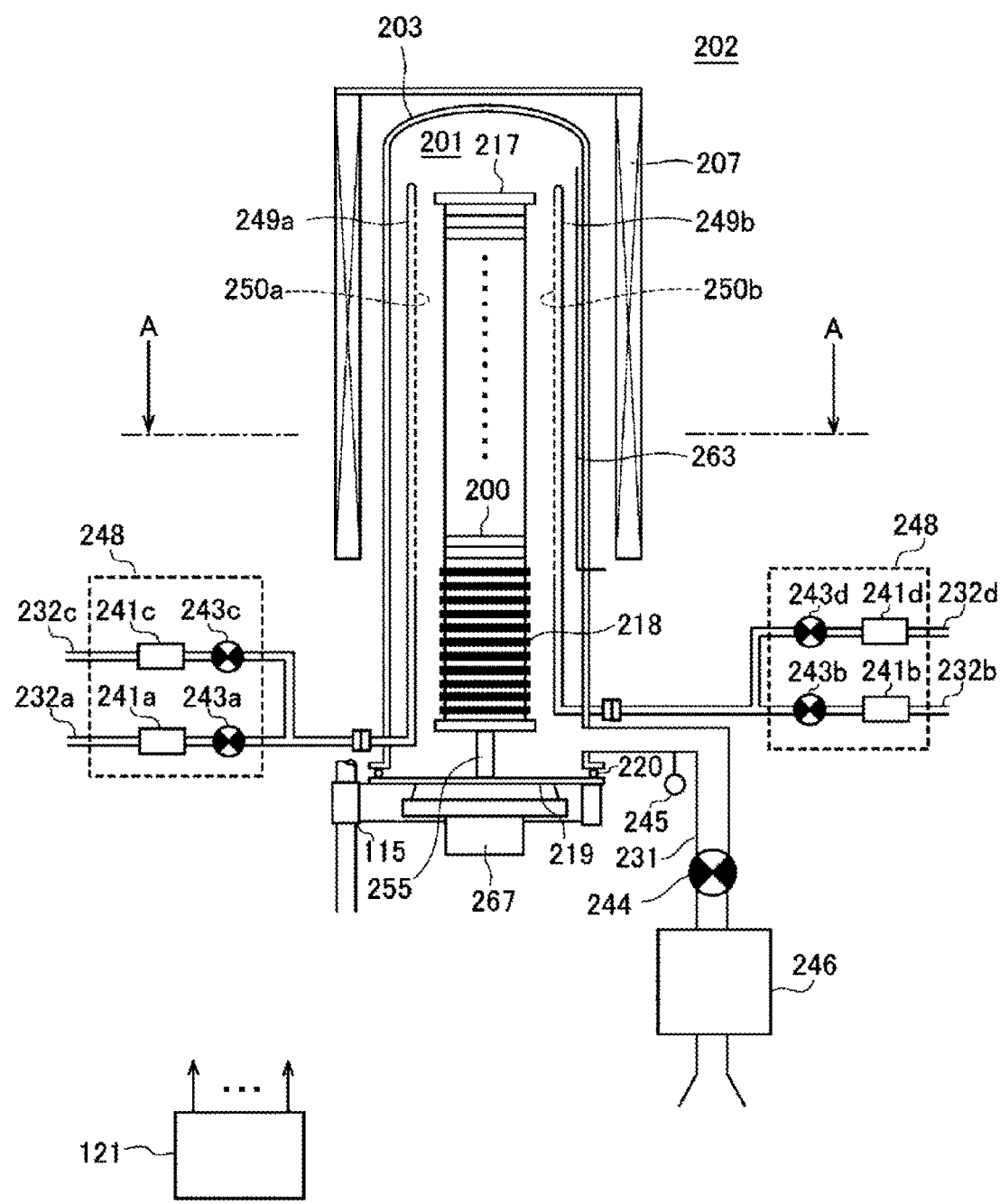
FIG. 1 is a schematic configuration diagram of a vertical process furnace of a substrate processing apparatus suitably used in one embodiment of the present disclosure, in which a part of the process furnace is shown in a vertical sectional view.

As shown in FIG. 1, a process furnace 202 includes a heater 207 as a heating means (heating mechanism). The heater 207 has a cylindrical shape and is vertically installed by being supported by a holding plate. The heater 207 also functions as an activation mechanism (excitation part) that thermally activates (excites) a gas.

Inside the heater 207, a reaction tube 203 as a process container is arranged concentrically with the heater 207. The reaction tube 203 is made of a heat-resistant material such as, for example, quartz ($SiO_2$) or silicon carbide (SiC) and is formed in a cylindrical shape with its upper end closed and its lower end opened. A process chamber 201 is formed in the hollow cylindrical portion of the reaction tube 203. The process chamber 201 is configured to arrange (accommodate) a plurality of wafers 200 as substrates in a vertical direction. The ceiling portion (upper end portion) of the reaction tube 203 is formed in a dome shape.

In the process chamber 201, nozzles 249a and 249b are installed so as to penetrate the lower side wall of the reaction tube 203. Gas supply pipes 232a and 232b are connected to the nozzles 249a and 249b, respectively.

Mass flow controllers (MFC) 241a and 241b as flow rate controllers (flow rate control pasts) and valves 243a and 243b as opening/closing valves are provided at the gas supply pipes 232a and 232b sequentially from the upstream side. Gas supply pipes 232c and 232d for supplying an inert gas are connected to the gas supply pipes 232a and 232b, respectively, on the downstream side of the valves 243a and 243b. MFCs 241c and 241d and valves 243c and 243d are provided at the gas supply pipes 232c and 232d sequentially from the upstream side.

Figure 2:
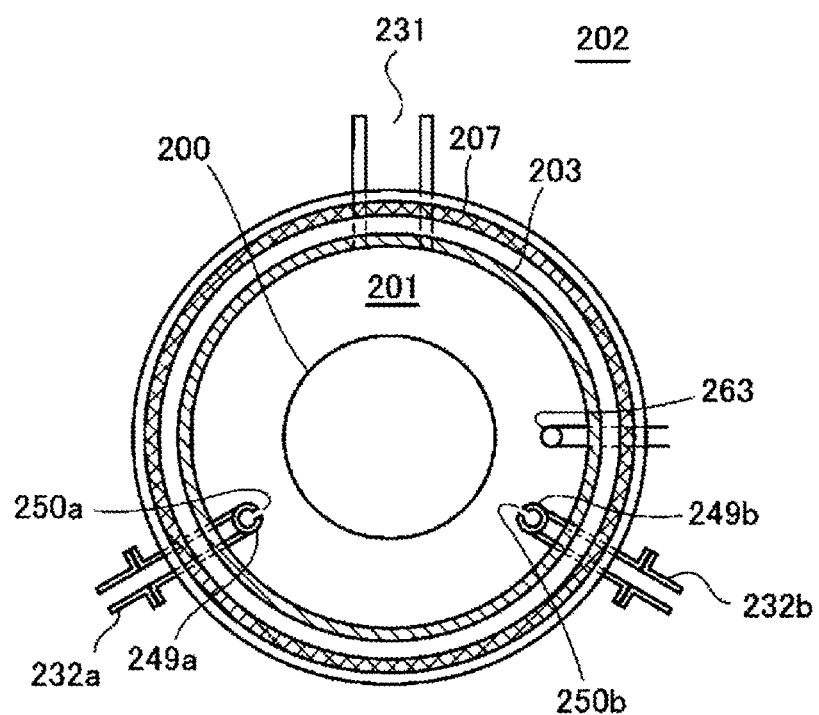
FIG. 2 is a schematic configuration diagram of a vertical process furnace of a substrate processing apparatus suitably used in one embodiment of the present disclosure, in which the process furnace is shown in a sectional view taken along line A-A in FIG. 1.

As shown in FIG. 2, the nozzles 249a and 249b are respectively provided at a space having an annular plan-view shape between the inner wall of the reaction tube 203 and the wafers 200, and are installed so as to extend upward in the arrangement direction of the wafers 200 from the lower portion of the inner wall of the reaction tube 203 to the upper portion thereof. That is, the nozzles 249a and 249b are respectively installed at a lateral side of a wafer arrangement region in which the wafers 200 are arranged, namely in a region which horizontally surrounds the wafer arrangement region, so as to extend along the wafer arrangement region. Gas supply holes 250a and 250b for supplying gases are formed on the side surfaces of the nozzles 249a and 249b, respectively. The gas supply holes 250a and 250b are respectively opened toward the center of the reaction tube 203 so as to allow a gas to be supplied toward the wafers 200. The gas supply holes 250a and 250b are formed in a plural number between the lower portion of the reaction tube 203 and the upper portion of the reaction tube 203.

As a process gas (precursor gas), a halosilane-based gas containing silicon (Si) as a main element constituting a film to be formed and a halogen element is supplied from the gas supply pipe 232a into the reaction tube 203 via the MFC 241a, the valve 243a and the nozzle 249a. The precursor gas refers to a gas in a gaseous state, for example, a gas obtained by vaporizing a precursor which remains in a liquid state under room temperature and atmospheric pressure, a precursor of a gaseous state under room temperature and atmospheric pressure, or the like. The halogen element includes chlorine (Cl), fluorine (F), bromine (Br), iodine (I), etc. For example, a chlorosilane-based gas containing Cl may be used as the halosilane-based gas. For example, a hexachlorodisilane ($Si_2Cl_6$, abbreviation: HCDS) gas may be used as the chlorosilane-based gas.

An amine-based gas, which is a gas containing carbon (C) and nitrogen (N), is supplied as a process gas (first reaction gas) from the gas supply pipe 232b into the reaction tube 203 via the MFC 241b, the valve 243b and the nozzle 249b. The amine-based gas is a gas composed of three elements of N, C and H. As the amine-based gas, it may be possible to use, for example, triethylamine (($C_2H_5)_3N$, abbreviation: TEA) gas.

An oxidizing gas (oxidizing agent), which is a gas containing oxygen (O), is supplied as a process gas (second reaction gas) from the gas supply pipe 232b into the reaction tube 203 via the MFC 241b, the valve 243b and the nozzle 249b. As the oxidizing gas, it may be possible to use, for example, oxygen ($O_2$) gas.

An inert gas is supplied from the gas supply pipes 232c and 232d into the reaction tube 203 via the MFCs 241c and 241d, the valves 243c and 243d, the gas supply pipes 232a and 232b, and the nozzles 249a and 249b, respectively. As the inert gas, it may be possible to use, for example, nitrogen ($N_2$) gas.

A process gas supply system (a precursor gas supply system, a first reaction gas supply system and a second reaction gas supply system) mainly includes the gas supply pipes 232a and 232b, the MFCs 241a and 241b, and the valves 243a and 243b. An inert gas supply system mainly includes the gas supply pipes 232c and 232d, the MFCs 241c and 241d, and the valves 243c and 243d.

One or all of various kinds of supply systems described above may be configured as an integrated supply system 248 in which the valves 243a to 243d, the MFCs 241a to 241d and the like are integrated. The integrated supply system 248 is connected to each of the gas supply pipes 232a to 232d and is configured such that the supply operations of the various kinds of gases into the gas supply pipes 232a to 232d, i.e., the opening/closing operation of the valves 243a to 243d, the flow rate adjusting operation of the MFCs 241a to 241d, and the like, are controlled by a controller 121 which will be described later. The integrated supply system 248 may be configured as an integral type or division type integrated unit. The integrated supply system 248 is detachable from the gas supply pipes 232a to 232d or the like on an integrated unit basis such that the maintenance, replacement, expansion or the like of the integrated supply system 248 can be performed on an integrated unit basis.

An exhaust pipe 231 configured to exhaust the internal atmosphere of the reaction tube 203 is connected to the reaction tube 203. A vacuum pump 246 as a vacuum exhaust device is connected to the exhaust pipe 231 via a pressure sensor 245 serving as a pressure detector (pressure detection part) for detecting the internal pressure of the reaction tube 203 and an APC (Auto Pressure Controller) valve 244 as a pressure regulator (pressure regulation part). The APC valve 244 is configured so that the vacuum exhaust and the vacuum exhaust stop of the interior of the process chamber 201 can be performed by opening and closing the APC valve 244 while operating the vacuum pump 246 and so that the internal pressure of the process chamber 201 can be regulated by adjusting the valve opening degree of the APC valve. While operating the vacuum pump 246, the valve opening degree of the APC valve 244 is adjusted based on the pressure information detected by the pressure sensor 245, whereby the "actual pressure" inside the process chamber 201 can approach a predetermined "set pressure". The "set pressure" inside the process chamber 201 may be considered as a synonym for a "target pressure" at the time of controlling the internal pressure of the process chamber 201. The "actual pressure" inside the process chamber 201 follows the value of the "set pressure." An exhaust system mainly includes the exhaust pipe 231, the APC valve 244 and the pressure sensor 245. The vacuum pump 246 may be included in the exhaust system.

A seal cap 219, which serves as a furnace opening lid configured to airtightly seal the lower end opening of the reaction tube 203, is installed below the reaction tube 203. The seal cap 219 is made of a metallic material such as, for example, SUS or the like and is formed in a disc shape. An O ring 220, which is a seal member making contact with the lower end of the reaction tube 203, is installed on the upper surface of the seal cap 219. A rotation mechanism 267 for rotating a boat 217, which will be described later, is installed under the seal cap 219. A rotating shaft 255 of the rotation mechanism 267 passes through the seal cap 219 and is connected to the boat 217. The rotation mechanism 267 is configured to rotate the wafers 200 by rotating the boat 217. The seal cap 219 is configured to be vertically moved up and down by a boat elevator 115, which is an elevating mechanism installed outside the reaction tube 203. The boat elevator 115 is configured as a transfer device (transfer mechanism) which loads and unloads (transfers) the wafers 200 into and out of the reaction tube 203 by moving the seal cap 219 up and down.

The boat 217 serving as a substrate support is configured so as to support a plurality of wafers 200, for example, 25 to 200 wafers 200, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as, for example, quartz or SiC. Heat insulating plates 218 made of a heat resistant material such as, for example, quartz or SiC are installed below the boat 217 in multiple stages.

A temperature sensor 263 as a temperature detector is installed in the reaction tube 203. By adjusting the power supply to the heater 207 based on the temperature information detected by the temperature sensor 263, the interior of the reaction tube 203 has a desired temperature distribution. The temperature sensor 263 is installed along the inner wall of the reaction tube 203.

Figure 3:
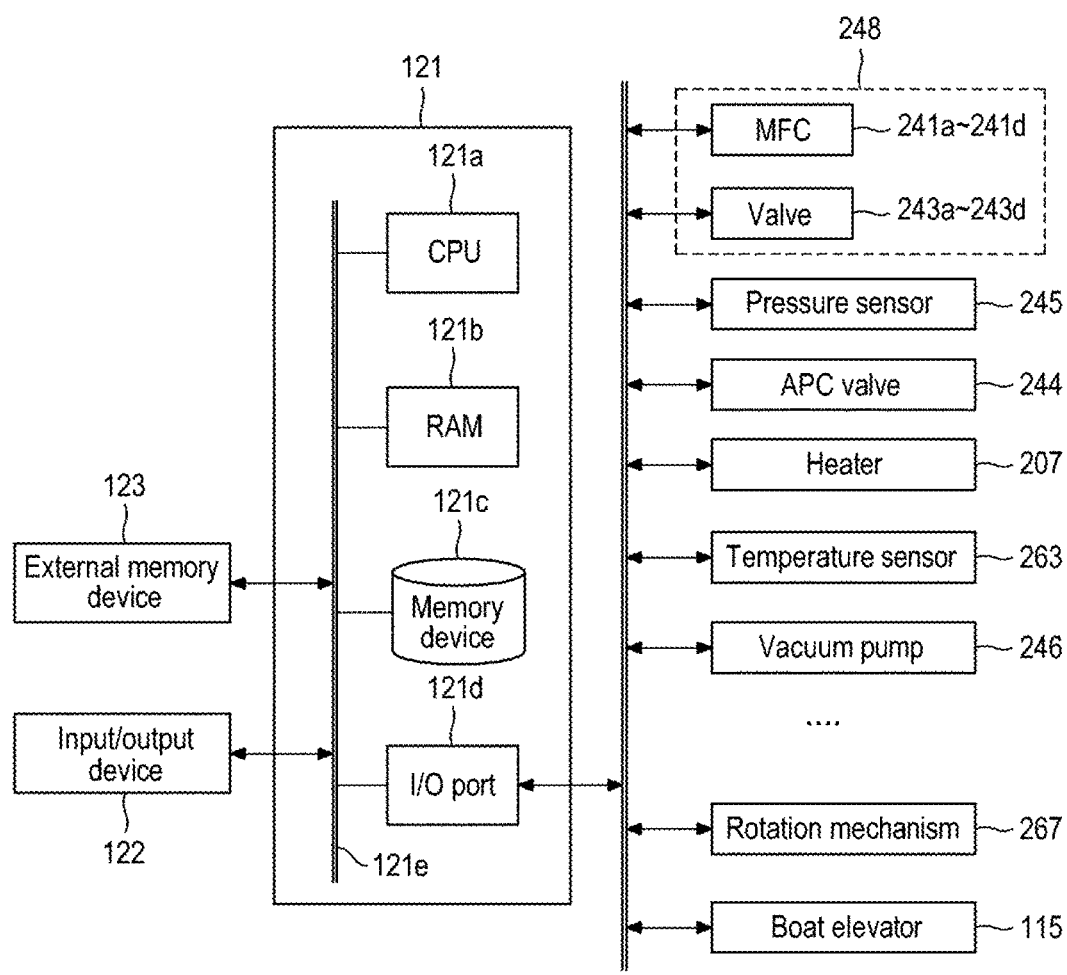
FIG. 3 is a schematic configuration diagram of a controller of a substrate processing apparatus suitably used in one embodiment of the present disclosure, in which a control system of a controller is shown in a block diagram.

As shown in FIG. 3, the controller 121 as a control part (control means) is configured as a computer including a CPU (Central Processing Unit) 121a, a RAM (Random Access Memory) 121b, a memory device 121c and an I/O port 121d. The RAM 121b, the memory device 121c, and the I/O port 121d are configured to exchange data with the CPU 121a via an internal bus 121e. An input/output device 122 including, for example, a touch panel or the like is connected to the controller 121.

The memory device 121c is configured by, for example, a flash memory, a hard disk drive (HDD), or the like. A control program for controlling operations of the substrate processing apparatus, a process recipe for specifying sequences and conditions of substrate processing as described hereinbelow, or the like is readably stored in the memory device 121c. The process recipe functions as a program for causing the controller 121 to execute each sequence in the substrate processing, which will be described hereinbelow, to obtain a predetermined result. Hereinafter, the process recipe and the control program will be generally and simply referred to as a "program." Furthermore, the process recipe will be simply referred to as a "recipe." When the term, "program" is used herein, it may indicate a case of including only the process recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241d, the valves 243a to 213d, the pressure sensor 245, the APC valve 244, the vacuum pump 246, the temperature sensor 263, the heater 207, the rotation mechanism 267, the boat elevator 115, and the like, as described above.

The CPU 121a is configured to read the control program from the memory device 121c and execute the same. The CPU 121a is also configured to read the recipe from the memory device 121c according to an input of an operation command from the input/output device 122. The CPU 121a is configured to control, according to the contents of the recipe thus read, the flow rate adjusting operation of various kinds of gases by the MFCs 241a to 241d, the opening/closing operation of the valves 243a to 243d, the opening/closing operation of the APC valve 244, the pressure regulating operation performed by the AFC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, and the like.

The controller 121 may be configured by installing, in a computer, the aforementioned program stored in an external memory device 123 (for example, a magnetic disk such as a HDD or the like, an optical disk such as a CD or the like, a magneto-optical disk such as an MO or the like, or a semiconductor memory such as a USB memory or the like). The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. The provision of the program to the computer may be performed by using a communication means such as the Internet or a dedicated line without using the external memory device 123.

(2) Substrate Processing Step

A sequence example of forming silicon oxycarbonitride films (SiOCN films) on a plurality of wafers 200 as substrates using the aforementioned substrate processing apparatus, which is one of the processes for manufacturing a semiconductor device, will be described below with reference to FIGS. 4 and 5. In the following descriptions, the operations of the respective parts that constitute the substrate processing apparatus are controlled by the controller 121.

The substrate processing of the present embodiment includes:
a wafer loading step of arranging a plurality of wafers 200 inside a reaction tube 203 as a process container in a vertical direction; and
a film-forming step of forming a SiOCN film on each of the plurality of wafers 200 by supplying a process gas into the reaction tube 203,
wherein the film-forming step includes:
a step of supplying a process gas into the reaction tube 203; and
a step of performing pressure control so that a pressure in the reaction tube 203 becomes a process pressure, and
wherein a start timing of the step of supplying the process gas is adjusted with respect to a start timing of the step of performing the pressure control to adjust the thickness of the SiOCN film formed on the wafer 200 arranged on an upper portion of the plurality of wafers 200.

Figure 4:
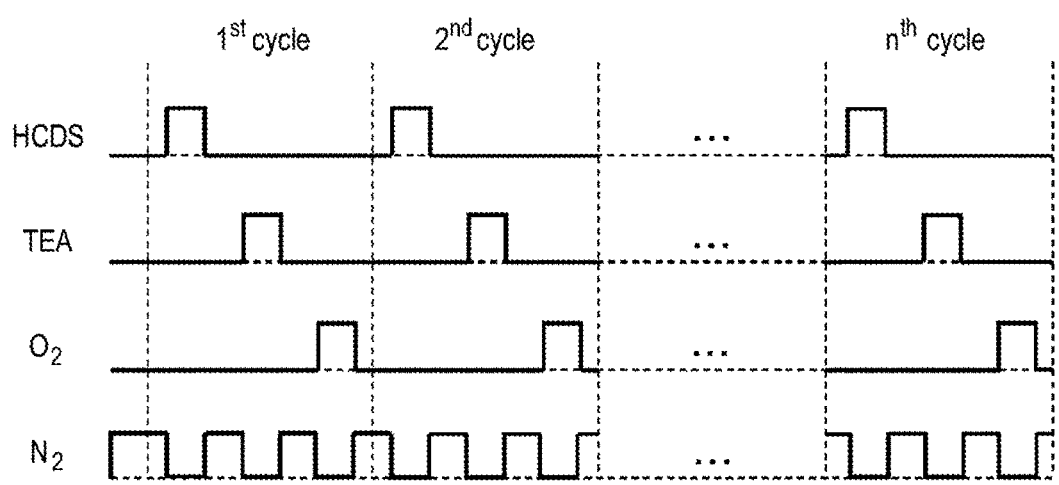
FIG. 4 is a diagram showing a gas supply sequence according to one embodiment of the present disclosure.

As in the gas supply sequence shown in FIG. 4, a film is formed by performing a cycle a predetermined number of times (n times where n is an integer of 1 or more), the cycle including non-simultaneously performing: step 1 of supplying a HCDS gas as a process gas to the wafers 200; step 2 of supplying a TEA gas as a process gas to the wafers 200; and a step 3 of supplying an O$_2$ gas as a process gas to the wafers 200.

In the present disclosure, for the sake of convenience, the gas supply sequence shown in FIG. 4 may be denoted as follows. The same denotation will also be used in the explanation of modifications to be described later.

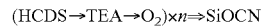

(HCDS→TEA→O$_2$)×n⇒SiOCN

When the term "wafer" is used herein, it may refer to "a wafer itself" or "a laminated body of a wafer and a predetermined layer or film formed on the surface of the wafer." Furthermore, when the phrase "a surface of a wafer" is used herein, it may refer to "a surface of a wafer itself" or "a surface of a predetermined layer or the like formed on a wafer." Moreover, the language "a predetermined layer is formed on a wafer" as used herein may mean that "a predetermined layer is directly formed on a surface of a wafer itself" or that "a predetermined layer is formed on a layer or the like formed on a wafer." In addition, when the term "substrate" is used herein, it may be synonymous with the term "wafer."

(Wafer Loading Step)

A plurality of wafers 200 is charged on the boat 217 (wafer charging). Thereafter, as shown in FIG. 1, the boat 217 supporting the plurality of wafers 200 arranged in the vertical direction is lifted up by the boat elevator 115 and is loaded into the reaction tube 203 (boat loading). In this state, the seal cap 210 seals the lower end of the reaction tube 203 through the O-ring 220.

As described above, the ceiling portion of the reaction tube 203 is formed in a dome shape. Therefore, in a state in which the plurality of wafers 200 is arranged inside the reaction tube 203 in a vertical direction, the space inside the reaction tube 203 (hereinafter referred to as an upper dome space), which is sandwiched between the inner wall of the ceiling portion of the reaction tube 203 and the wafers 200 arranged on the upper end portion of the plurality of wafers 200, is larger than the space inside the reaction tube 203 (hereinafter referred to as an inter-wafer space), which is sandwiched between the adjacent wafers 200 among the plurality of wafers 200. The volume of the upper dome space is larger than the volume of the inter-wafer space. The upper dome space is a relatively large space in which an obstacle or the like interfering with a gas flow does not exist. The conductance of the upper dome space is larger than the conductance of the inter-wafer space.

(Vacuum Exhaust Step and Temperature Adjustment Step)

The space inside the reaction tube 203, i.e., the space where the wafers 200 are located, is depressurization-exhausted (vacuum-exhausted) by the vacuum pump 246. Specifically, the opening degree of the APC valve 244 is set to a full open degree. Rather, the valves 243c and 243d are opened to allow an $N_2$ gas to flow into the gas supply pipes 232c and 232d. The flow rate of the $N_2$ gas is adjusted by the MFCs 241c and 241d. The $N_2$ gas is supplied into the process chamber 201 through the nozzles 249a and 249b and is exhausted from the exhaust pipe 231. The flow rates of the $N_2$ gas supplied from the gas supply pipes 232c and 232d may be respectively set to fall within the range of, for example, 10 to 10,000 sccm. The pressure (actual pressure) inside the reaction tube 203 is lower than a processing pressure to be described later, and becomes to fall within the range of, for example, 1 to 40 Pa (i.e., pressure in the vacuum exhaust). At this time, instead of setting the opening degree of the APC valve 244 to a full open degree, the opening degree of the APC valve 244 may be adjusted to control the pressure so that the pressure inside the reaction tube 203 falls within the range of, for example, 1 to 40 Pa.

Further, the wafers 200 in the reaction tube 203 are heated by the heater 207 so that the wafers 200 have a desired temperature. At this time, the state of supplying electric power to the heater 207 is feedback-controlled based on the temperature information detected by the temperature sensor 263 so that the interior of the reaction tube 203 has a desired temperature distribution (temperature adjustment). In addition, the rotation of the wafers 200 by the rotation mechanism 267 is started.

The exhaust of the interior of the reaction tube 203 and the heating and rotation of the wafers 200 are continuously performed at least until the processing on the wafers 200 is completed.

(Film-Forming Step)

Then, the following steps 1 to 3 are executed sequentially.

[Step 1]

This step is executed by step 1A for supplying a HCDS gas into the reaction tube 203 and step 1B for performing pressure control so that the pressure inside the reaction tube 203 becomes a process pressure.

In step 1A, the valve 243a is opened to allow a HCDS gas to flow into the gas supply pipe 232a. The flow rate of the HCDS gas is adjusted by the MFC 241a. The HCDS gas is supplied into the reaction tube 203 via the nozzle 249a and is exhausted from the exhaust pipe 231. At this time, the HCDS gas is supplied to the wafers 200. During the execution period of step 1A, the supply flow rate of the $N_2$ gas from the gas supply pipes 232c and 232d may be decreased, or the supply of the $N_2$ gas may be stopped as shown in FIG. 4. In these cases, the supply flow rates of the $N_2$ gas from the gas supply pipes 232c and 232d may be respectively set to fall within the range of, for example, 0 to 10000 sccm, specifically 0 to 5000 sccm. In addition, during the period other than the execution period of step 1A, the supply of the $N_2$ gas from the gas supply pipes 232c and 232d may be continued, and the supply flow rate thereof may become the same as the supply flow rate of the $N_2$ gas in the vacuum exhaust step.

In step 1B, the opening degree of the APC valve 244 is adjusted so that the pressure inside the reaction tube 203 becomes a predetermined set pressure (process pressure). At this time, the opening degree of the APC valve 244 is feedback-controlled based on the pressure information in the reaction tube 203, which is measured by the pressure sensor 245, so that the actual pressure in the reaction tube 203 reaches the process pressure. By reducing the opening degree of the APC valve 244 while continuing the supply of the $N_2$ gas and the HCDS gas into the reaction tube 203, it is possible to increase the pressure inside the reaction tube 203 to the process pressure which is higher than the vacuum exhaust pressure.

Figure 5:
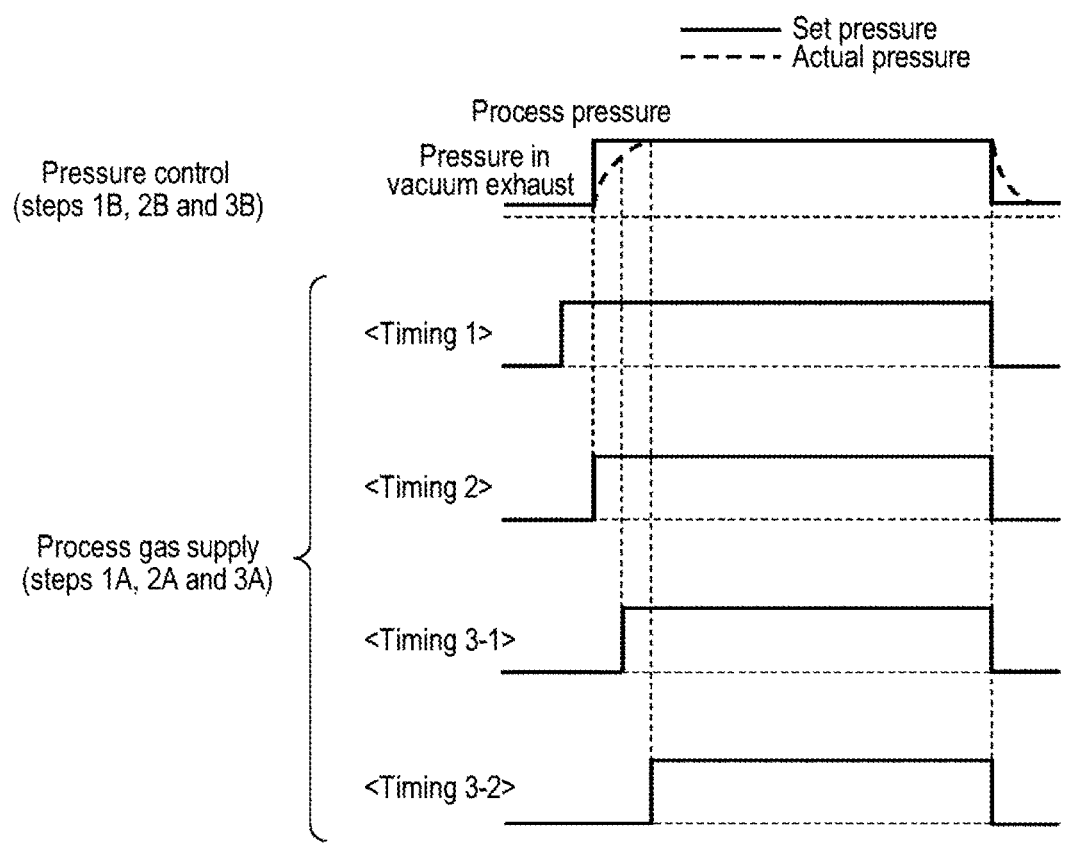
FIG. 5 is a diagram showing an example of adjusting a start timing of supplying a process gas with respect to a start timing of performing pressure control.

In step 1, as shown in FIG. 5, the start timing of step 1A (HCDS gas supply) with respect to the start timing of step 1B (pressure control) is adjusted. More specifically, as the start timing of step 1A, one of the timing before the start of step 1B (timing 1), the timing that is simultaneous with the start of step 1B (timing 2) and the timing after the start of step 1B (timing 3-1 or 3-2) is selected. The effect obtained by the selection of these timings will be described later.

An example of the processing conditions in step 1 is as follows.

HCDS gas supply flow rate: 1 to 2000 sccm, specifically 10 to 1000 sccm

HCDS gas supply time: 1 to 120 seconds, specifically 1 to 60 seconds

Process temperature: 250 to 800 degrees C., specifically 400 to 700 degrees C.

Process pressure (set pressure): 67 to 2666 Pa, specifically 133 to 1333 Pa

By supplying the HCDS gas to the wafer 200 under the above-mentioned conditions, a Si-containing layer containing Cl is formed as a first layer on the outermost surface of the wafer 200. The Si-containing layer containing Cl is formed by physisorption of HCDS, chemisorption of a substance (hereinafter referred to as "$Si_xCl_y$") partially decomposed from HCDS on the outermost surface of the wafer 200, pyrolysis of HCDS or the like, on the outermost surface of the wafer 200. The Si-containing layer containing Cl may be an adsorption layer (a physisorption layer or a chemisorption layer) of HCDS or $Si_xCl_y$, or may be a Si layer containing Cl. In the present disclosure, the Si-containing layer containing Cl is also simply referred to as a Si-containing layer.

After forming the first layer on the wafer 200, the executions of steps 1A and 1B are completed. Specifically, the valve 243a is closed, and the supply of the HCDS gas into the reaction tube 203 is stopped. Further, the opening degree of the APC valve 244 is set to a full open degree to vacuum exhaust the interior of the reaction tube 203, and the gas or the like remaining in the reaction tube 203 is removed from the reaction tube 203. At this time, the valves 243c and 243d are opened, and the $N_2$ gas is supplied into the reaction tube 203 at the same supply flow rate as the supply flow rate of the $N_2$ gas in the vacuum exhaust step. The $N_2$ gas acts as a purge gas. By maintaining this state for a predetermined time, the pressure inside the reaction tube 203 can be lowered to the vacuum exhaust pressure.

As the precursor gas, in addition to the HCDS gas, it may be possible to use, for example, chlorosilane-based gases such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, an octachlorotrisilane ($Si_3Cl_8$, abbreviation: OCTS) gas, and the like. Furthermore, as the precursor gas, it may be possible to use a tetrafluorosilane ($SiF_4$) gas, a tetrabromosilane ($SiBr_4$) gas, a tetraiodosilane ($SiI_4$) gas, and the like. That is, as the precursor gas, it may be possible to use halosilane-based gases other than the chlorosilane-based gases, such as a fluorosilane-based gas, a bromosilane-based gas, an iodosilane-based gas and the like.

As the inert gas, in addition to the $N_2$ gas, it may be possible to use, for example, various rare gases such as an Ar gas, a He gas, a Ne gas, a Xe gas, and the like. This is the same as steps 2 and 3 which will be described later.

[Step 2]

After step 1 is completed, step 2A of supplying a TEA gas to the wafer 200 in the reaction tube 203, i.e., the first layer formed on the wafer 200, and step 2B of performing pressure control such that the pressure inside the reaction tube 203 becomes the process pressure, are executed.

In step 2A, the opening/closing control of the valves 243b to 243d is performed in the same manner as the opening/closing control of the valves 243a, 243c and 243d in step 1A. The flow rate of the TEA gas is adjusted by the MFC 241b. The TEA gas is supplied into the reaction tube 203 via the nozzle 249b and is exhausted from the exhaust pipe 231. At this time, the TEA gas is supplied to the wafer 200.

In step 2B, the opening degree control of the APC valve 244 is performed in the same manner as the opening degree control of the APC valve 244 in step 1B. By decreasing the opening degree of the APC valve 244 while continuing the supply of the $N_2$ gas and the TEA gas into the reaction tube 203, it is possible to increase the pressure inside the reaction tube 203 to the process pressure which is higher than the vacuum exhaust pressure.

Also in step 2, as shown in FIG. 5, it is possible to adjust the start timing of step 2A (the supply of the TEA gas) with respect to the start timing of step 2B (the pressure control). Specifically, as the start timing of step 2A, one of the timing before the start of step 2B (timing 1), the timing that is simultaneous with the start of step 2B (timing 2) and the timing after the start of step 2B (liming 3-1 or 3-2) is selected. The effect obtained by the selection of these timings will be described later.

An example of the processing conditions in step 2 is as follows.

TEA gas supply flow rate: 1 to 2000 sccm, specifically 10 to 1000 sccm

TEA gas supply time: 1 to 120 seconds, specifically 1 to 60 seconds

Process pressure (set pressure): 67 to 4000 Pa, specifically 67 to 3000 Pa

Other processing conditions are the same as the processing conditions in step 1.

By supplying the TEA gas to the wafer 200 under the above-described conditions, it is possible to allow the first layer formed on the wafer 200 in step 1 to react with the TEA gas. As a result, it is possible to desorb Cl from the first layer and to incorporate an N component and a C component contained in the TEA gas into the first layer. By modifying the first layer in this manner, a layer containing Si, C and N, i.e., a silicon carbonitride layer (SiCN layer) is formed as a second layer on the wafer 200.

After forming the second layer on the wafer 200, the executions of steps 2A and 2B are completed. Specifically, the valve 243b is closed, and the supply of the TEA gas into the reaction tube 203 is stopped. Further, by the same processing procedure as in step 1, the gas and the like remaining in the reaction tube 203 are removed from the interior of the reaction tube 203, and the pressure inside the reaction tube 203 is decreased to the vacuum exhaust pressure.

As the process gas (first reaction gas), in addition to the TEA gas, it may be possible to use an ethylamine-based gas such as a diethylamine (($C_2H_5)_2NH$, abbreviation: DEA) gas, a monoethylamine ($C_2H_5NH_2$, abbreviation: MEA) gas or the like, a methylamine-based gas such as a trimethylamine (($CH_3)_3N$, abbreviation: TMA) gas, a dimethylamine (($CH_3)_2NH$, abbreviation: DMA) gas, a monomethylamine ($CH_3NH_2$, abbreviation: MMA) or the like, a propylamine-based gas such as a tripropylamine (($C_3H_7)_3N$, abbreviation: TPA) gas, a dipropylamine (($C_3H_7)_2NH$, abbreviation: DPA) gas, a monopropylamine ($C_3H_7NH_2$, abbreviation: MPA) or the like, an isopropylamine-based gas such as a triisopropylamine ([($CH_3)_2CH]_3N$, abbreviation: TIPA) gas, a diisopropylamine ([($CH_3)_2CH]_2NH$, abbreviation: DIPA) gas, a monoisopropylamine (($CH_3)_2CHNH_2$, abbreviation: MIPA) gas or the like, a butylamine-based gas such as a tributylamine (($C_4H_9)_3N$, abbreviation: TBA) gas, a dibutylamine (($C_4H_9)_2NH$, abbreviation: DBA) gas, a monobutylamine ($C_4H_9NH_2$, abbreviation: MBA) or the like, and an isobutylamine-based gas such as a triisobutylamine ([($CH_3)_2CHCH_2]_3N$, abbreviation: TIBA) gas, a diisobutylamine ([($CH_3)_2CHCH_2]_2NH$, DIBA) gas, a monoisobutylamine (($CH_3)_2CHCH_2NH_2$, abbreviation: MIBA) gas or the like.

Furthermore, as the process gas (first reaction gas), in addition to the amine-based gas, it may be possible to use an organic hydrazine-based gas. As the organic hydrazine-based gas, it may be possible to use a methyl hydrazine-based gas such as a monomethyl hydrazine (($CH_3)HN_2H_2$, abbreviation: MMH) gas, a dimethyl hydrazine (($CH_3)_2N_2H_2$, abbreviation: DMH) gas, a trimethyl hydrazine (($CH_3)_2N_2(CH_3)H$, abbreviation: TMH) gas or the like, and an ethyl hydrazine-based gas such as ethyl hydrazine (($C_2H_5)HN_2H_2$, abbreviation EH) gas or the like.

[Step 3]

After step 2 is completed, step 3A of supplying an $O_2$ gas to the wafer 200 in the reaction tube 203, i.e., the second layer formed on the wafer 200, and step 3B of performing pressure control so that the pressure inside the reaction tube 203 becomes the process pressure are executed.

In step 3A, the opening/closing control of the valves 243b to 243d is performed in the same manner as the opening/closing control of the valves 243a, 243c and 243d in step 1A. The flow rate of the $O_2$ gas is adjusted by the MFC 241b. The $O_2$ gas is supplied into the reaction tube 203 through the nozzle 249b and is exhausted from the exhaust pipe 231. At this time, the $O_2$ gas is supplied to the wafer 200.

In step 3B, the opening degree control of the APC valve 244 is performed in the same manner as the opening degree control of the APC valve 244 in step 1B. By reducing the opening degree of the APC valve 244 while continuing the supply of the $N_2$ gas and the $O_2$ gas into the reaction tube 203, it is possible to increase the pressure inside the reaction tube 203 to the process pressure which is higher than the vacuum exhaust pressure.

Also in step 3, as shown in FIG. 5, it is possible to adjust the start timing of step 3A (the supply of the $O_2$ gas) with respect to the start timing of step 3B (the pressure control). Specifically, as the start timing of step 3A, one of the timing before the start of step 3B (timing 1), the timing that is simultaneous with the start of step 3B (timing 2) and the timing after the start of step 3B (timing 3-1 or 3-2) is selected. The effect obtained by the selection of these timings will be described later.

An example of the processing conditions in step 3 is as follows.

O$_2$ gas supply flow rate: 100 to 10000 sccm

O$_2$ gas supply time: 1 to 120 seconds, specifically 1 to 60 seconds

Process pressure (set pressure): 67 to 4000 Pa, specifically 67 to 3000 Pa

Other processing conditions are the same as the processing conditions in step 1.

By supplying the O$_2$ gas to the wafer 200 under the above-mentioned conditions, it is possible to oxidize at least a portion of the second layer formed on the wafer 200 in step 2. As a result, Cl can be desorbed from the second layer and an O component contained in the O$_2$ gas can be incorporated into the second layer. As the second layer is oxidized, a layer containing Si, O, C and N, i.e., a silicon oxycarbonitride layer (SiOCN layer) is formed as a third layer on the wafer 200.

After forming the third layer on the wafer 200, the executions of steps 3A and 3B are completed. Specifically, the valve 243b is closed to stop the supply of the O$_2$ gas into the reaction tube 203. Furthermore, the gas and the like remaining in the reaction tube 203 are removed from the interior of the reaction tube 203 by the same processing procedure as in step 1, and the pressure inside the reaction tube 203 is reduced to the vacuum exhaust pressure.

As the process gas (second reaction gas), in addition to the O$_2$ gas, it may be possible to use a nitrous oxide (N$_2$O) gas, a nitrogen monoxide (NO) gas, a nitrogen dioxide (NO$_2$) gas, a water vapor (H$_2$O gas), a carbon monoxide (CO) gas, a carbon dioxide (CO$_2$) gas, an ozone (O$_3$) gas, a plasma-excited O$_2$ gas (O$_2$*), an O$_2$ gas+a hydrogen (H$_2$) gas, and the like.

[Performing a Predetermined Number of Times]

A SiOCN film having a desired composition and a desired film thickness can be formed on the wafer 200 by performing a cycle one or more times (n times), the cycle including non-simultaneously, i.e., non-synchronously performing steps 1 to 3. In the film-forming step, steps 1A to 3A and steps 1B to 3B are intermittently performed. It is desirable that the cycle described above is repeated a plurality of times. That is, it is desirable that the thickness of the third layer formed per one cycle is set to be smaller than a desired film thickness, and the cycle described above is repeated a plurality of times until the film thickness of the SiOCN film formed by laminating the third layer becomes the desired film thickness.

(After Purging Step and Atmospheric Pressure Restoration Step)

After the SiOCN film having a desired composition and a desired film thickness is formed on the wafer 200, an N$_2$ gas is supplied from each of the nozzles 249a and 249b into the reaction tube 203 and is exhausted from the exhaust pipe 231. As a result, the interior of the reaction tube 203 is purged, and the gas and the reaction byproduct remaining in the reaction tube 203 are removed from the reaction tube 203 (after purge). Thereafter, the atmosphere in the reaction tube 203 is substituted by an inert gas (inert gas substitution), and the pressure in the reaction tube 203 is restored to the atmospheric pressure (atmospheric pressure restoration).

(Wafer Unloading Step)

The seal cap 219 is lowered by the boat elevator 115 and the lower end of the reaction tube 203 is opened. Then, the processed wafers 200 are unloaded from the lower end of the reaction tube 203 to the outside of the reaction tube 203 in a state in which the processed wafers 200 are supported by the boat 217 (boat unloading). After unloading the boat 217 to the outside of the reaction tube 203, the processed wafers 200 are discharged from the boat 217 (wafer discharging).

(3) Effects According to the Present Embodiment

According to the above-described embodiment, one or more effects described below may be achieved.

(a) By adjusting the start timing of step 1A (HCDS gas supply) with respect to the start timing of step 1B (pressure control), it is possible to adjust the thickness of the SiOCN film formed on the wafer 200 arranged on the upper portion of the plurality of wafers 200. This makes it possible to control the film thickness uniformity (WtW) of the SiOCN film between the wafers 200.

More specifically, as the start timing of step 1A, one of the timing before the start of step 1B (timing 1), the timing that is simultaneous with the start of step 1B (timing 2) and the timing after the start of step 1B (timing 3-1 or 3-2) is selected. That is, the supply of the HCDS gas may be started before the pressure inside the reaction tube 203, which is lower titan the process pressure, reaches the process pressure (for example, in the course of reaching the process pressure), or the supply of the HCDS gas may be started after the pressure inside the reaction tube 203, which is lower than the process pressure, reaches the process pressure. Through these selection operations, it is possible to adjust the thickness of the SiOCN film formed on the wafer 200 disposed on the upper portion of the plurality of wafers 200.

For example, in the case where timing 1 or 2 is selected as the start timing of step 1A, as compared with the case of selecting timing 3-1 or 3-2, it is possible to increase the thickness of the SiOCN film formed on the wafer 200 arranged on the upper portion of the plurality of wafers 200. This is because, when such timing is selected as the start timing of step 1A, the HCDS gas is supplied and diffused into the vacuum-exhausted reaction tube 203 (the reaction tube 203 whose pressure has been reduced to the vacuum exhaust pressure). In this case, the HCDS gas is more preferentially introduced into the upper dome space having a relatively large conductance (the upper dome space which is exhausted to the vacuum exhaust pressure and in which molecules are small) than the inter-wafer space having a relatively small conductance. As a result, it is possible to perform control in such a direction as to increase the supply amount of the HCDS gas supplied to the wafer 200 arranged on the upper side among the plurality of wafers 200, and it becomes possible to realize the above-mentioned film thickness control. In addition, by selecting timing 1 as the start timing of step 1A rather than selecting timing 2, it is possible to preferentially introduce the HCDS gas into the upper dome space for a long time. Therefore, the above-mentioned effect can be more easily obtained.

Further, for example, in the case where timing 3-1 or 3-2 is selected as the start timing of step 1A, as compared with the case of selecting timing 1 or 2, it is possible to reduce the thickness of the SiOCN film formed on the wafer 200 arranged on the upper portion of the plurality of wafers 200. Thus, when such a timing is selected as the start timing of step 1A, in step 1B, the opening degree of the APC valve 244 is reduced while continuing the supply of the N$_2$ gas into the reaction tube 203 at least until the start of step 1A, and the pressure inside the reaction tube 203 is increased by the N$_2$ gas. That is, the pressure control in the reaction tube 203 is started using the N$_2$ gas. Therefore, in the case where timing 3-1 or 3-2 is selected as the start timing of step 1A, at the start of step 1A, it becomes a state in which a large amount of N$_2$ gas has already been introduced into the upper dome space having a large conductance (a state in which the upper dome space is filled with the N$_2$ gas), and the introduction of the HCDS gas into the upper dome space is restricted by the presence of the N$_2$ gas. As a result, it is possible to perform control in such a direction as to reduce the supply amount of the HCDS gas supplied to the wafer 200 arranged on the upper portion of the plurality of wafers 200. This makes it possible to realize the above-mentioned film thickness control. By selecting timing 3-2 as the start timing of step 1A rather than selecting timing 3-1, it is possible to more reliably restrict the introduction of the HCDS gas into the upper dome space and to more easily obtain the above-mentioned effect. On the other hand, in the case of selecting timing 3-1, by adjusting the time taken from the start of step 1B to the start of step 1A, it is possible to finely adjust the thickness of the SiOCN film formed on the wafer 200 arranged on the upper portion of the plurality of wafers 200.

(b) By adjusting the start timing of step 2A (the supply of the TEA gas) with respect to the start timing of step 2B (the pressure control) in the same manner as in step 1, it is possible to adjust the composition of the SiOCN film formed on the wafer 200 arranged on the upper portion of the plurality of wafers 200.

For example, in the case where timing 1 or 2 is selected as the start timing of step 2A, as compared with the case of selecting timing 3-1 or 3-2, it is possible to adjust, in an increasing direction, the C concentration and the N concentration (especially, the C concentration) of the SiOCN film formed on the wafer 200 arranged on the upper side among the plurality of wafers 200. This is because, by selecting these timings as the start timing of step 2A, it is possible to perform control in such a direction as to increase the supply amount of the TEA gas supplied to the wafer 200 arranged on the upper portion of the plurality of wafers 200. This reason is similar to the reason described in step 1. By selecting timing 1 as the start timing of step 2A rather than selecting timing 2, it is possible to preferentially introduce the TEA gas into the upper dome space for a long time. Therefore, the above-mentioned effect can be more easily obtained.

Further, for example, in the case where timing 3-1 or 3-2 as the start timing of step 2A, as compared with the case of selecting timing 1 or 2, it is possible to adjust, in a decreasing direction, the C concentration and the N concentration in the SiOCN film formed on the wafer 200 arranged on the upper portion of the plurality of wafers 200. This is because, by selecting these timings as the start timing of step 2A, it is possible to perform control in such a direction as to reduce the supply amount of the TEA gas supplied to the wafer 200 arranged on the upper portion of the plurality of wafers 200. This reason is similar to the reason described in step 1. By selecting timing 3-2 as the start timing of step 2A rather than selecting timing 3-1, it is possible to more reliably restrict the introduction the TEA gas into the upper dome space and to more easily obtain the above-mentioned effect. On the other hand, in the case where timing 3-1 is selected, by adjusting the time taken from the start of step 2B to the start of step 2A, it is possible to finely adjust the C concentration and the N concentration in the SiOCN film formed on the wafer 200 arranged on the upper portion of the plurality of wafers 200.

(c) By adjusting the start timing of step 3A (the supply of the O$_2$ gas) with respect to the start timing of step 3B (the pressure control) in the same manner as in step 1, it is possible to adjust the composition of the SiOCN film formed the wafer 200 arranged on the upper portion of the plurality of wafers 200.

For example, in the case where timing 1 or 2 is selected as the start timing of step 3A, as compared with the case of selecting timing 3-1 or 3-2, it is possible to adjust the O concentration in the SiOCN film formed on the wafer 200 arranged on the upper portion of the plurality of wafers 200 in an increasing direction (in such a direction as to reduce the C concentration and the N concentration). This is because, by selecting these timings as the start timing of step 3A, it is possible to perform control in such a direction as to increase the supply amount of the O$_2$ gas supplied to the wafer 200 arranged on the upper portion of the plurality of wafers 200. This reason is similar to the reason described in step 1. By selecting timing 1 as the start timing of step 3A rather than selecting timing 2, it is possible to preferentially introduce the O$_2$ gas into the upper dome space for a long time and to more easily obtain the above-mentioned effect.

Further, for example, in the case where timing 3-1 or 3-2 is selected as the start timing of step 3A, as compared with the case of selecting timing 1 or 2, it is possible to adjust the O concentration in the SiOCN film formed on the wafer 200 arranged on the upper portion of the plurality of wafers 200 in a decreasing direction (in such a direction as to increase the C concentration and the N concentration). This is because, by selecting these timings as the start timing of step 3A, it becomes possible to perform control in such a direction as to reduce the supply amount of the O$_2$ gas supplied to the wafer 200 arranged on the upper portion of the plurality of wafers 200. This reason is similar to the reason described in step 1. By selecting timing 3-2 as the start timing of step 3A rather than selecting timing 3-1, it is possible to more reliably restrict the introduction of the O$_2$ gas into the upper dome space and to more easily obtain the above-mentioned effect. On the other hand, when selecting timing 3-1, by adjusting the time taken front the start of step 3B to the start of step 3A, it is possible to finely adjust the O concentration in the SiOCN film formed on the wafer 200 arranged on the upper portion of the plurality of wafers 200.

(d) The above-described effects can be similarly obtained when a Si-containing gas other than the HCDS gas is used as the precursor gas, when a gas containing N and C other than the TEA gas is used as the first reaction gas, or when an O-containing gas other than the O$_2$ gas is used as the second reaction gas.

(4) Modification Examples

The present embodiment may be modified as in the following modification examples. Further, these modification examples may be arbitrarily combined.

Modification Example 1

As the start timing of supplying a process gas of at least one of a HCDS gas, a TEA gas and an O$_2$ gas, one of the timing before the start of pressure control (timing 1), the timing that is simultaneous with the start of pressure control (timing 2) and the timing after pressure control (timing 3-1 or 3-2) may be selected to start a film-forming step of forming a SiOCN film. During the film-forming step, the process gas supply start timing may be changed to another timing different from the one selected from timings 1, 2, 3-1 and 3-2, and the film-forming step may be continued.

For example, timing 1 may be selected as the start timing of step 1A to start the film-forming step, the start timing of step 1A may be changed to one of timings 2, 3-1 and 3-2 in the middle of the film-forming step, and the film-forming step may be continued. Further, for example, timing 3-2 may be selected as the start timing of step 1A to start the film-forming step, the start timing of step 1A may be changed to one of timings 1, 2 and 3-1 in the middle of the film-forming step, and the film-forming step may be continued.

Modification Example 2

As the start timing of supplying a process gas of at least one of a HCDS gas, a TEA gas and an $O_2$ gas, the timing after the pressure control (timing 3-1) may be selected to start a film-forming step for forming a SiOCN film. During the film-forming step, the time taken from the start of the pressure control to the start of supply of the process gas may be changed, and the film-forming step may be continued.

For example, timing 3-1 may be selected as the start timing of step 1A to start the film-forming step. During the film-forming step, the time (T1) taken from the start of step 1B to the start of step 1A may be changed in a shortening direction, and the film-forming step may be continued. For example, T1 may be set to 20 seconds in the former half of the film-forming step, and T1 may be changed to 15 seconds in the middle of the film-forming step (T1 may be set to 15 seconds in the latter half of the film-forming step). Further, for example, timing 3-1 may be selected as the start timing of step 1A to start the film-forming step. During the film-forming step, the time (T1) taken from the start of step 1B to the start of step 1A may be changed in a lengthening direction, and the film-forming step may be continued. For example, T1 may be set to 20 seconds in the former half of the film-forming step, and T1 may be changed to 25 seconds in the middle of the film-forming step (T1 may be set to 25 seconds in the latter half of the film-forming step).

Modification Example 3

When vacuum-exhausting the interior of the reaction tube 203 in the vacuum exhaust step or steps 1 to 3, the supply of the $N_2$ gas from the gas supply pipes 232c and 232d into the reaction tube 203 may not be performed. In this case, the vacuum exhaust pressure in the reaction tube 203 is set to fall within the range of, for example, 1 to 5 Pa. However, when selecting timing 3-1 or 3-2 as the start timing of step 1A, 2A or 3A, it is necessary to increase the pressure inside the reaction tube 203 to the process pressure without supplying the process gas into the reaction tube 203 during the time taken from the start of step 1B, 2B or 3B to the start of step 1A, 2A and 3A. Therefore, at least during that time, it is necessary to perform the supply of the $N_2$ gas from the gas supply pipes 232c and 232d into the reaction tube 203.

Other Embodiments

The embodiment of the present disclosure has been concretely described above. However, the present disclosure is not limited to the embodiment described above, and various changes may be made without departing from the spirit of the present disclosure.

As the process gas, in addition to the above-described halosilane-based gas, it may be possible to use, for example, at alkylhalosilane-based gas such as a 1,1,2,2-tetrachloro-1,2-dimethyldisilane (($CH_3)_2Si_2Cl_4$, abbreviation: TCDMDS) gas or the like, and an aminosilane-based gas such as a trisdimethylaminosilane ($Si[N(CH_3)_2]_3H$, abbreviation: 3DMAS) gas or a bisdiethylaminosilane ($SiH_2[N(C_2H_5)_2]_2$, abbreviation: BDEAS) gas. In addition, a silicon hydride gas such as a monosilane ($SiH_4$) gas or a disilane ($Si_2H_6$) gas may be used.

Further, as the process gas, in addition to the first and second reaction gases mentioned above, it may be possible to use, for example, an N-containing gas (nitriding agent) such as an ammonia ($NH_3$) gas or the like, a C-containing gas such as a propylene ($C_3H_6$) gas or the like, and a boron (B)-containing gas such as a trichloroborane ($BCl_3$) gas or the like.

For example, by the following gas supply sequences, a silicon oxynitride film (SiON film), a silicon carbonitride film (SiCN film), a SiOCN film, a silicon boron carbonitride film (SiBCN film), a silicon boron nitride film (SiBN film) and a silicon oxide film (SiO film) may be formed on the wafer 200.

(HCDS→$NH_3$→$O_2$)×$n$⇒SiON (HCDS→TEA)×$n$⇒SiCN (TCDMDS→$NH_3$)×$n$⇒SiCN (TCDMDS→$NH_3$→$O_2$)×$n$⇒SiOCN (HCDS→$C_3H_6$→$NH_3$→$O_2$)×$n$⇒SiOCN (HCDS→$C_3H_6$→$BCl_3$→$NH_3$)×$n$⇒SiBCN (HCDS→$BCl_3$→$NH_3$)×$n$⇒SiBN (HCDS→$O_2$+$H_2$)×$n$⇒SiO (3DMAS→$O_3$)×$n$⇒SiO (BDEAS→$O_2$*)×$n$⇒SiO

In the above-described embodiment, there has been described an example in which a film containing Si as a main element is formed on a substrate. However, the present disclosure is not limited to such an embodiment. That is, the present disclosure may be suitably applied to a case where a film containing not only Si but also a semimetal element such as germanium (Ge), boron (B) or the like as a main element is formed on a substrate. In addition, the present disclosure may be suitably applied to a case where a film containing a metal element such as titanium (Ti), zirconium (Zr), hafnium (Hf), niobium (Nb), tantalum (Ta), molybdenum (Mo), tungsten (W), yttrium (Y), lanthanum (La), strontium (Sr), aluminum (Al) or the like as a main element is formed on a substrate.

For example, the present disclosure may be suitably applied to a case where, by using a titanium tetrachloride ($TiCl_4$) gas or a trimethylaluminum (Al($CH_3)_3$, abbreviation: TMA) gas as a process gas, according to the gas supply sequences shown below, a titanium nitride film (TiN film), a titanium oxynitride film (TiON film), a titanium aluminum carbonitride film (TiAlCN film), a titanium aluminum carbide film (TiAlC film), a titanium carbonitride film (TiCN film), a titanium oxide film (TiO film) and the like are formed on a substrate.

($TiCl_4$→$NH_3$)×$n$⇒TiN ($TiCl_4$→$NH_3$→$O_2$)×$n$⇒TiON ($TiCl_4$→TMA→$NH_3$)×$n$⇒TiAlCN ($TiCl_4$→TMA)×$n$⇒TiAlC ($TiCl_4$→TEA)×$n$⇒TiCN ($TiCl_4$→$H_2O$)×$n$⇒TiO

It is desirable that the recipes used in the substrate processing are individually prepared according to the processing contents and stored in the memory device 121c via a telecommunication line or the external memory device 123. When starting the substrate processing, it is desirable that the CPU 121a appropriately selects an appropriate recipe from the plurality of recipes stored in the memory device 121c according to the substrate processing contents. This makes it possible to form films of various film types, composition ratios, film qualities and film thicknesses with high reproducibility in one substrate processing apparatus. It is also possible to reduce the burden on an operator and to quickly start the process while avoiding operation errors.

The above-described recipes are not limited to the case of newly creating them, but may be prepared by, for example, changing the existing recipes already installed in the substrate processing apparatus. In the case of changing the recipes, the changed recipes may be installed in the substrate processing apparatus via an electric communication line or a recording medium in which the recipes are recorded. In addition, by operating the input/output device 122 installed in the existing substrate processing apparatus, the existing recipes already installed in the substrate processing apparatus may be directly changed.

In the above-described embodiment, there has been described an example where a film is formed using a batch type substrate processing apparatus that processes a plurality of substrates at a time. The present disclosure is not limited to the above-described embodiment, but may be suitably applied to, for example, a case where a film is formed using a single-wafer type substrate processing apparatus that processes one or several substrates at a time. Furthermore, in the above-described embodiment, there has been described an example where a film is formed using a substrate processing apparatus including a hot wall type process furnace. The present disclosure is not limited to the above-described embodiment, but may be suitably applied to a case where a film is formed using a substrate processing apparatus including a cold wall type process furnace.

Even in the case of using these substrate processing apparatuses, film formation can be performed under the same processing procedure and processing conditions as those of the above-described embodiment and modifications, and the same effects as those of the above-described embodiment and modifications can be obtained.

Further, the above-described embodiment and modifications may be used in combination as appropriate. The processing procedures and processing conditions at this time may be the same as, for example, the processing procedures and processing conditions of the above-described embodiment.

EXAMPLES

Hereinafter, Examples will be described.

In Example 1, by using the substrate processing apparatus shown in FIG. 1, according to the gas supply sequence shown in FIG. 4, a SiOCN film was formed on each of a plurality of wafers. Timing 3-2 was selected as the start timing of step 1A, and the time difference between the start timing of step 1A and the start timing of step 1B was set to 12 seconds. Other processing conditions were set to predetermined conditions falling within the processing condition range described in the above-described embodiment.

In Example 2, by using the substrate processing apparatus shown in FIG. 1, according to the gas supply sequence shown in FIG. 4, a SiOCN film was formed on each of a plurality of wafers. Timing 3-1 was selected as the start timing of step 1A, and the time difference between the start timing of step 1A and the start timing of step 1B was set to 6 seconds. Other processing conditions were the same as the processing conditions in Example 1.

Example 3, by using the substrate processing apparatus shown in FIG. 1, according to the gas supply sequence shown in FIG. 4, a SiOCN film was formed on each of a plurality of wafers. Timing 2 was selected as the start timing of step 1A, and the time difference between the start timing of step 1A and the start timing of step 1B was set to 0 second. Other processing conditions were the same as the processing conditions in Example 1.

Figure 6:
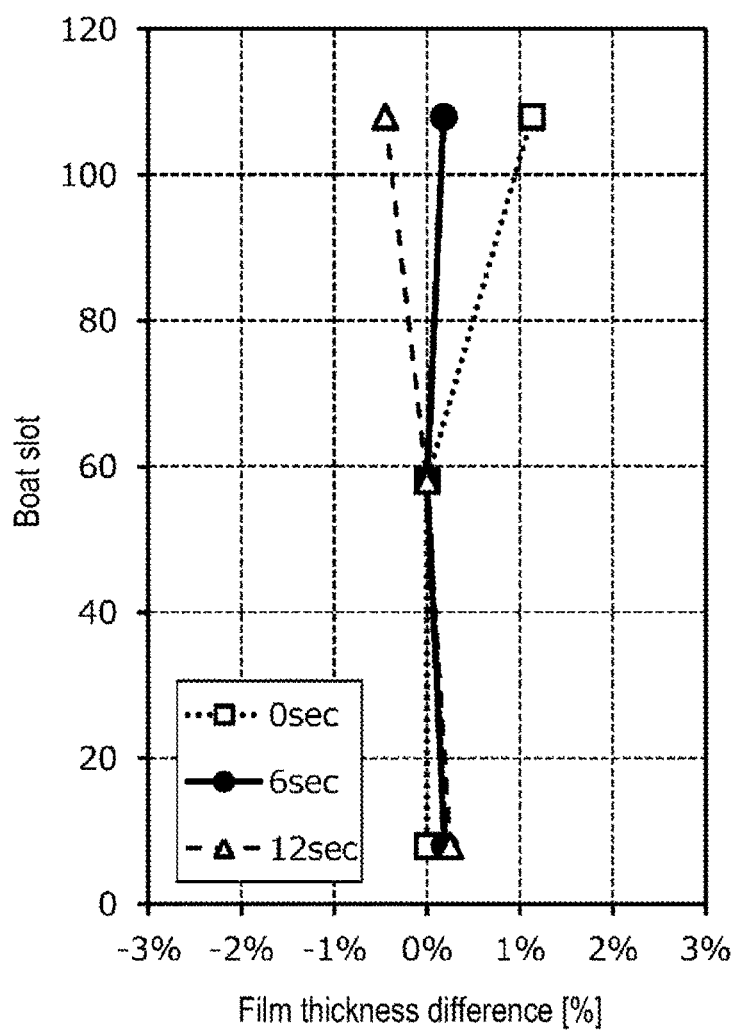
FIG. 6 is a diagram showing the evaluation results of the inter-substrate film thickness uniformity of films formed on substrates.

The thicknesses of the respective SiOCN films formed on the upper, middle and bottom wafers among the plurality of wafers used in Examples 1 to 3 were measured. FIG. 6 shows the measurement results of the film thicknesses of the SiOCN films. The vertical axis in FIG. 6 indicates the boat slot, i.e., the position of the wafer (120 is the uppermost slot of the boat, and 0 is the lowermost slot of the boat). The horizontal axis in FIG. 6 indicates the film thickness difference between the film thickness of the SiOCN film formed on the wafer and the film thickness (reference film thickness) of the SiOCN film formed on the middle wafer in terms of the ratio to the reference film thickness (=(film thickness difference/reference film thickness)×100). In FIG. 6, ∆, ● and □ indicate Examples 1, 2 and 3, respectively, and show the differences in film thickness of the respective SiOCN films formed on the upper, middle and lower wafers sequentially from the top.

According to FIG. 6, it can be seen that the thickness of the SiOCN film formed on the wafer arranged on the upper portion of the plurality of wafers becomes larger in the order of Examples 3, 2 and 1 (largest in Example 3 in which timing 2 is selected). That is, it can be noted that, in the case of selecting timing 2 as the start timing of the step 1A, as compared with the case of selecting timing 3-1 or 302, it is possible to perform control so as to increase the thickness of the SiOCN film formed on the wafer arranged on the upper portion of the plurality of wafers. Further, it can be understood that, in the case of selecting timing 3-1 as the start timing of the step 1A, as compared with the case of selecting timing 3-2, it is possible to perform control so as to increase the thickness of the SiOCN film formed on the wafer arranged on the upper portion of the plurality of wafers. Moreover, according to FIG. 6, it can be seen that, regardless of whether any one of timings 2, 3-1 and 3-2 is selected as the start timing of step 1A, the thickness of the SiOCN film formed on the middle wafer among the plurality of wafers and the thickness of the SiOCN film formed on the lower wafer among the plurality of wafers are hardly affected. That is, according to the method of the above-described embodiment, it can be understood that it is possible to selectively adjust the thickness of the SiOCN film formed on the wafer arranged on the upper portion of the plurality of wafers.

According to the present disclosure in some embodiments, it is possible to control the inter-substrate uniformity of film thickness when forming a film on each of a plurality of substrates arranged in a vertical direction.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    arranging a plurality of substrates inside a process container in a vertical direction; and
    forming a film on each of the plurality of substrates by supplying a process gas into the process container,
    wherein the act of forming the film includes:
        supplying the process gas into the process container; and
        performing pressure control such that a pressure inside the process container becomes a process pressure, and
    wherein a start timing of the act of supplying the process gas is adjusted with respect to a start timing of the act of performing the pressure control to adjust a thickness of a film formed on a substrate arranged on an upper portion of the plurality of substrates.

2. The method of claim 1, wherein the thickness of the film formed on the substrate arranged on the upper portion is adjusted by selecting one of a timing before a start of the act of performing the pressure control, a timing that is simultaneous with a start of the act of performing the pressure control and a timing after the start of the act of performing the pressure control as the start timing of the act of supplying the process gas.

3. The method of claim 1, wherein the act of supplying the process gas is started before the pressure inside the process container reaches the process pressure.

4. The method of claim 1, wherein the act of supplying the process gas is started before the pressure inside the process container, which increases from a pressure lower than the process pressure, reaches the process pressure.

5. The method of claim 1, wherein the act of supplying the process gas is started after the pressure inside the process container reaches the process pressure.

6. The method of claim 5, wherein the act of supplying the process gas is started after the pressure inside the process container, which has increased from a pressure lower than the process pressure, reaches the process pressure.

7. The method of claim 1, wherein a timing before a start of the act of performing the pressure control or a timing that is simultaneous with a start of the act of performing the pressure control is selected as the start timing of the act of supplying the process gas, so that the thickness of the film formed on the substrate arranged on the upper portion becomes thicker than a thickness of a film formed on the substrate arranged on the upper portion when a timing after the start of the act of performing the pressure control is selected.

8. The method of claim 1, wherein a timing after a start of the act of performing the pressure control is selected as the start timing of the act of supplying the process gas, so that the thickness of the film formed on the substrate arranged on the upper portion becomes thinner than a thickness of a film formed on the substrate arranged on the upper portion when a timing before the start of the act of performing the pressure control or a timing that is simultaneous with the start of the act of performing the pressure control is selected.

9. The method of claim 1, wherein a timing after a start of the act of performing the pressure control is selected as the start timing of the act of supplying the process gas and a time taken from the start of the act of performing the pressure control to a start of the act of supplying the process gas is adjusted, so that the thickness of the film formed on the substrate arranged on the upper portion is finely adjusted.

10. The method of claim 1, wherein in the act of forming the film, the act of supplying the process gas and the act of performing the pressure control are intermittently performed.

11. The method of claim 10, wherein one of a timing before a start of the act of performing the pressure control, a timing that is simultaneous with the start of the act of performing the pressure control and a timing after the start of the act of performing the pressure control is selected as the start timing of the act of supplying the process gas, and the act of forming the film is started, and
    wherein, during the act of forming the film, the start timing of the act of supplying the process gas is changed to another timing different from the one of the timing before the start of the act of performing the pressure control, the timing that is simultaneous with the start of the act of performing the pressure control and the timing after the start of the act of performing the pressure control, and the act of forming the film is continued.

12. The method of claim 10, wherein a timing after a start of the act of performing the pressure control is selected as the start timing of the act of supplying the process gas, and the act of forming the film is started, and
    wherein, during the act of forming the film, a time taken from the start of the act of performing the pressure control to a start of the act of supplying the process gas is changed, and the act of forming the film is continued.

13. The method of claim 1, wherein the process container includes a ceiling portion having a dome shape.

14. The method of claim 1, wherein a space in the process container, which is a sandwiched portion between an inner wall of a ceiling portion of the process container and a substrate disposed at an upper end portion of the plurality of substrates, is larger than a space in the process container, which is a sandwiched portion between adjacent substrates among the plurality of substrates.

15. A non-transitory computer-readable recording medium storing a program that causes, by a computer, a substrate processing apparatus to perform:
    arranging a plurality of substrates inside a process container in a vertical direction; and
    forming a film on each of the plurality of substrates by supplying a process gas into the process container,
    wherein the act of forming the film includes:
        supplying the process gas into the process container; and
        performing pressure control such that a pressure inside the process container becomes a process pressure, and
    wherein a start timing of the act of supplying the process gas is adjusted with respect to a start timing of the act of performing the pressure control to adjust a thickness of a film formed on a substrate arranged on an upper portion of the plurality of substrates.

* * * * *